(12) United States Patent
Park et al.

(10) Patent No.: US 10,128,414 B2
(45) Date of Patent: Nov. 13, 2018

(54) CHIP SUBSTRATE PROVIDED WITH JOINING GROOVES IN LENS INSERT

(71) Applicant: Point Engineering Co., Ltd., Asan-si (KR)

(72) Inventors: Seung Ho Park, Hwaseong-si (KR); Tae Hwan Song, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 262 days.

(21) Appl. No.: 14/985,275

(22) Filed: Dec. 30, 2015

(65) Prior Publication Data

US 2016/0197245 A1 Jul. 7, 2016

(30) Foreign Application Priority Data

Jan. 2, 2015 (KR) .................. 10-2015-0000026

(51) Int. Cl.
| | |
|---|---|
| *H01L 33/58* | (2010.01) |
| *H01L 33/48* | (2010.01) |
| *H01L 33/64* | (2010.01) |

(52) U.S. Cl.
CPC .......... *H01L 33/486* (2013.01); *H01L 33/58* (2013.01); *H01L 33/644* (2013.01); *H01L 2224/48137* (2013.01)

(58) Field of Classification Search
CPC .......... G02B 7/02; G02B 7/023; G02B 7/003; G02B 7/021; G02B 7/08
See application file for complete search history.

(56) References Cited

U.S. PATENT DOCUMENTS

| 9,374,890 B2 | 6/2016 | Ahn et al. | |
|---|---|---|---|
| 2006/0245195 A1* | 11/2006 | Kim | H01L 33/62 |
| | | | 362/294 |
| 2007/0235743 A1* | 10/2007 | Lee | H01L 33/483 |
| | | | 257/81 |
| 2013/0126913 A1* | 5/2013 | Hwu | H01L 25/0753 |
| | | | 257/88 |
| 2014/0327024 A1* | 11/2014 | Ishihara | H01L 24/97 |
| | | | 257/98 |

* cited by examiner

*Primary Examiner* — Davienne Monbleau
*Assistant Examiner* — Leslie Pilar Cruz
(74) *Attorney, Agent, or Firm* — Sunstein Kann Murphy & Timbers LLP

(57) ABSTRACT

A chip substrate includes: a plurality of conductive layers horizontally stacked and constituting the chip substrate; a plurality of insulation layers alternately with the conductive layers and electrically separating the conductive layers; a lens insert comprising a groove having a predetermined number of edges on the upper surface of the chip substrate and having a cross-section wherein an arc is formed at the region where the extended edges meet; a cavity comprising a groove reaching down to a predetermined depth towards the area accommodating the insulation layer within the internal region of the lens insert; and a plurality of joining grooves formed on the surface of the lens insert. Thus, the lens to be inserted also can be formed to be a shape comprising straight lines so that the manufacturing process of the lens to be inserted into the chip substrate can be further simplified.

8 Claims, 3 Drawing Sheets

CHIP SUBSTRATE PROVIDED WITH JOINING GROOVES IN LENS INSERT

CROSS-REFERENCE TO RELATED PATENT APPLICATION

This U.S. non-provisional patent application claims priority under 35 U.S.C. § 119 of Korean Patent Application No. 10-2015-0000026 filed on Jan. 2, 2015 in the Korean Patent Office, the entire contents of which are hereby incorporated by reference.

BACKGROUND

1. Technical Field

The present invention relates to a chip substrate and a method for manufacturing same, more particularly, relates to a chip substrate provided with joining grooves in lens insert.

2. Description of the Related Art

Traditionally, a chip mounting space in a chip substrate has been formed on the upper surface of the chip substrate using a mechanical machining or a chemical etching process. When an optical device chip such as a UV LED is being mounted in such a chip substrate, a downwardly narrowing space has been formed in order to enhance the optical reflection capability. After forming such a space, the chip is mounted and a lens is formed when sealing the mounting space, thereby enhancing the optical efficiency.

At this time, when forming the lens, since the mounting space is formed to have a circular shape when viewed from the upper surface of the chip substrate, the shape of the lens is formed to have a circular shape corresponding thereto. However, in order to machine the lens precisely to be a circular shape, there have been difficulties in manufacturing process compared to machining of a lens formed with straight lines of a rectangle or a triangle.

Furthermore, in bonding the lens there has been a problem that the sealant is being overflowed and penetrating into the light emitting section of the chip substrate.

SUMMARY

In accordance with exemplary embodiments of the invention, a structure for a chip substrate is configured with a space for lens insertion is formed to be a shape comprising straight lines.

Further embodiments include a structure which is capable of accommodating the overflowing adhesive by providing a plurality of joining grooves inside the lens insert.

A chip substrate provided with joining grooves inside the lens insert according to an exemplary embodiment of the present invention for solving the above described technical problems includes: a plurality of conductive layers horizontally stacked and constituting the chip substrate; a plurality of insulation layers alternately with the conductive layers and electrically separating the conductive layers; a lens insert comprising a groove having a predetermined number of edges on the upper surface of the chip substrate and having a cross-section wherein an arc is formed at the region where the extended edges meet; a cavity comprising a groove reaching down to a predetermined depth towards the area accommodating the insulation layer within the internal region of the lens insert; and a plurality of joining grooves formed on the surface of the lens insert.

The chip substrate further includes a first metal pad formed on a unit area on the conductive layers being separated by at least one of the insulation layers inside the cavity.

The chip substrate further includes a second metal pad being successively formed on the plurality of insulation layers separated from the plurality of insulation layers inside the cavity.

The joining grooves include: a first joining groove being formed surrounding the outer area of the cavity on the surface of the lens insert; and a second joining groove being formed surrounding the first joining groove.

The chip substrate further includes a heat radiating portion being attached to the bottom surface of the chip substrate.

The chip substrate further includes a plurality of marking portions to indicate the unit areas inside the cavity.

The chip substrate further includes an electrode marking portion to indicate an electrode for at least any one conductive layer separated from the conductive layers by the insulation layer on the upper surface of the chip substrate.

The chip substrate further includes a plurality of side grooves, at the side surfaces of the chip substrate, inwardly concave and accommodating the insulation layers.

DETAILED DESCRIPTION OF EMBODIMENTS

Contents of the description below merely exemplify the principle of the invention. Therefore those of ordinary skill in the art may implement the theory of the invention in various apparatuses which are included within the concept and the scope of the invention even though it is not clearly explained or illustrated in the description. Furthermore, in principle all the conditional terms and embodiments listed in this description are clearly intended for the purpose of understanding the concept of the invention, and one should understand that this invention is not limited to such specially listed exemplary embodiments.

Hereinafter, a preferred exemplary embodiment according to the present invention will be described with reference to the accompanying drawings. For convenience sake, an LED will be explained as a chip.

In the present exemplary embodiment, in order to manufacture a chip substrate, conductive layers containing multiple conductive materials having a predetermined thickness are alternately stacked with insulation layers interposed therebetween.

A chunk of conductive material wherein a plurality of insulation layers are arranged spaced apart is produced by applying heat and pressure as it is being stacked.

Next, the chunk of conductive material produced in such a way is vertically diced into pieces so that the insulation layers are to be included in each of the diced pieces, thereby completing the manufacturing of a chip substrate, wherein multiple vertical insulation layers are arranged in parallel and spaced apart. That is, in the present exemplary embodiment, one direction is a vertical direction, and the chunk of conductive material is being vertically diced with respect to the direction of stacking, thereby manufacturing chip substrates.

A lens insert and a cavity are formed in the chip substrate manufactured by dicing according to the above described method, and thus, a chip substrate provided with joining grooves inside the lens insert according to the present exemplary embodiment is manufactured.

Figure 2:
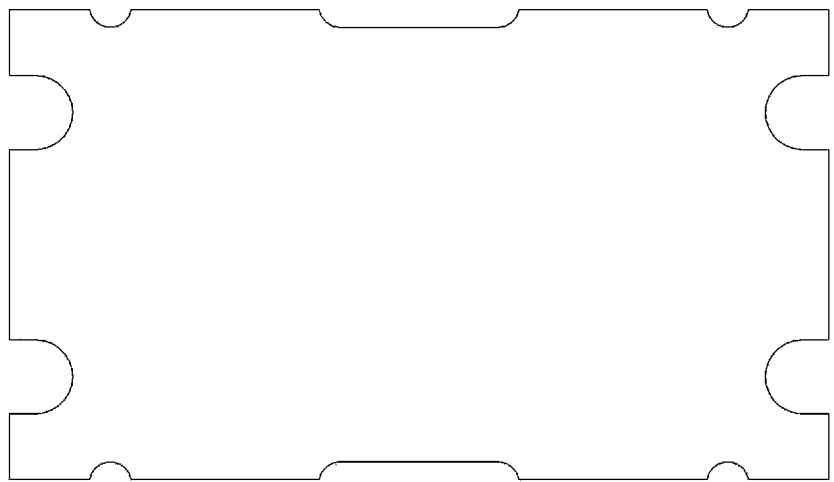
FIG. 2 is a rear view of a chip substrate provided with a plurality of joining grooves inside the lens insert according to an exemplary embodiment of the present invention.
Figure 3:
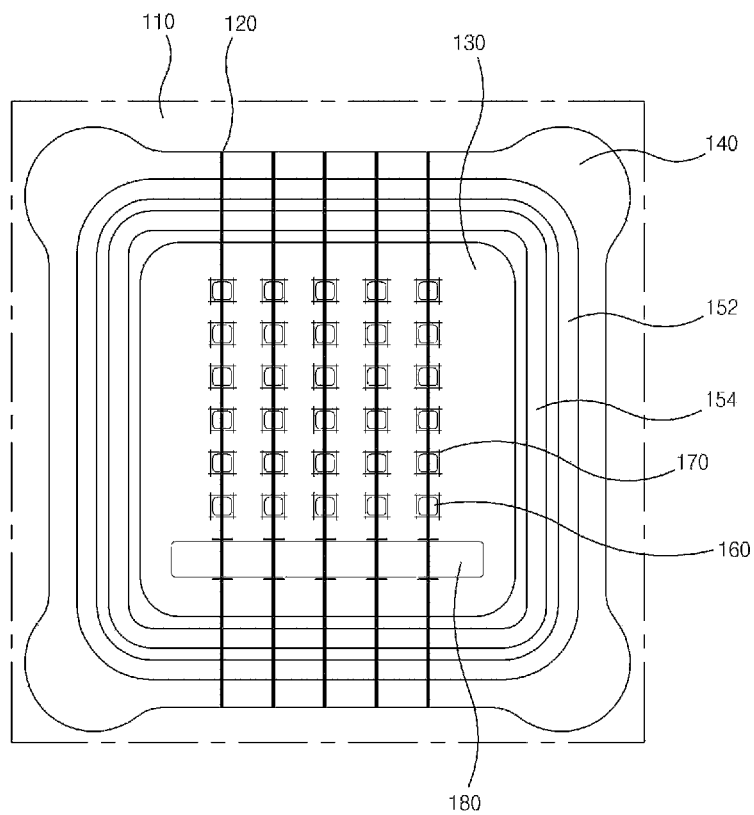
FIG. 3 is a top view of a chip substrate provided with a plurality of joining grooves inside the lens insert according to an exemplary embodiment of the present invention.
Figure 4:
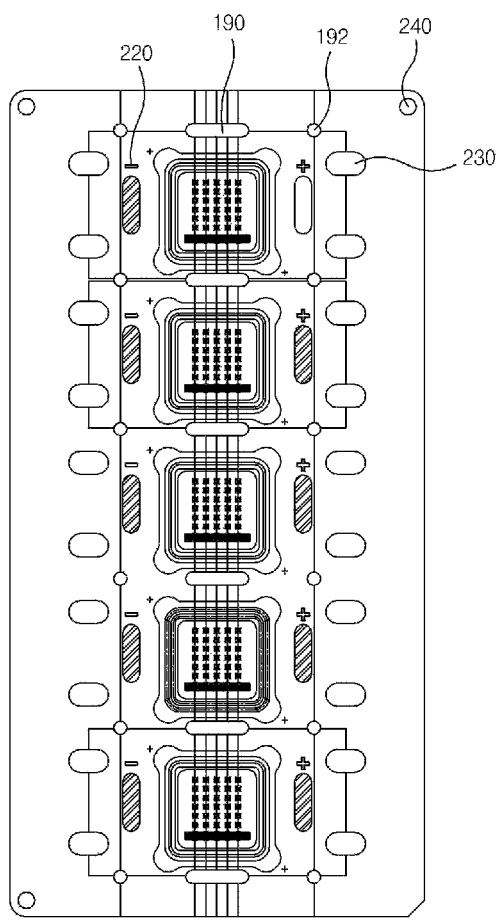
FIG. 4 is a top view of a chip substrate provided with a plurality of joining grooves inside the lens insert according to another exemplary embodiment of the present invention.

The chip substrate according to another exemplary embodiment may have the shape as shown in FIG. 4, and a plurality of lens inserts and cavities may be formed in the upper surface of the chip substrate. However, for a more detailed description, a chip substrate including one lens insert or one cavity will be explained as an example. That is, a chip substrate according to FIGS. 1 to 3 is a unit chip substrate, and it can be manufactured by dicing the lens inserts as a unit.

Hereinafter, with reference to FIG. 1, a chip substrate provided with a plurality of joining grooves inside the lens insert according to an exemplary embodiment will be described.

Figure 1:
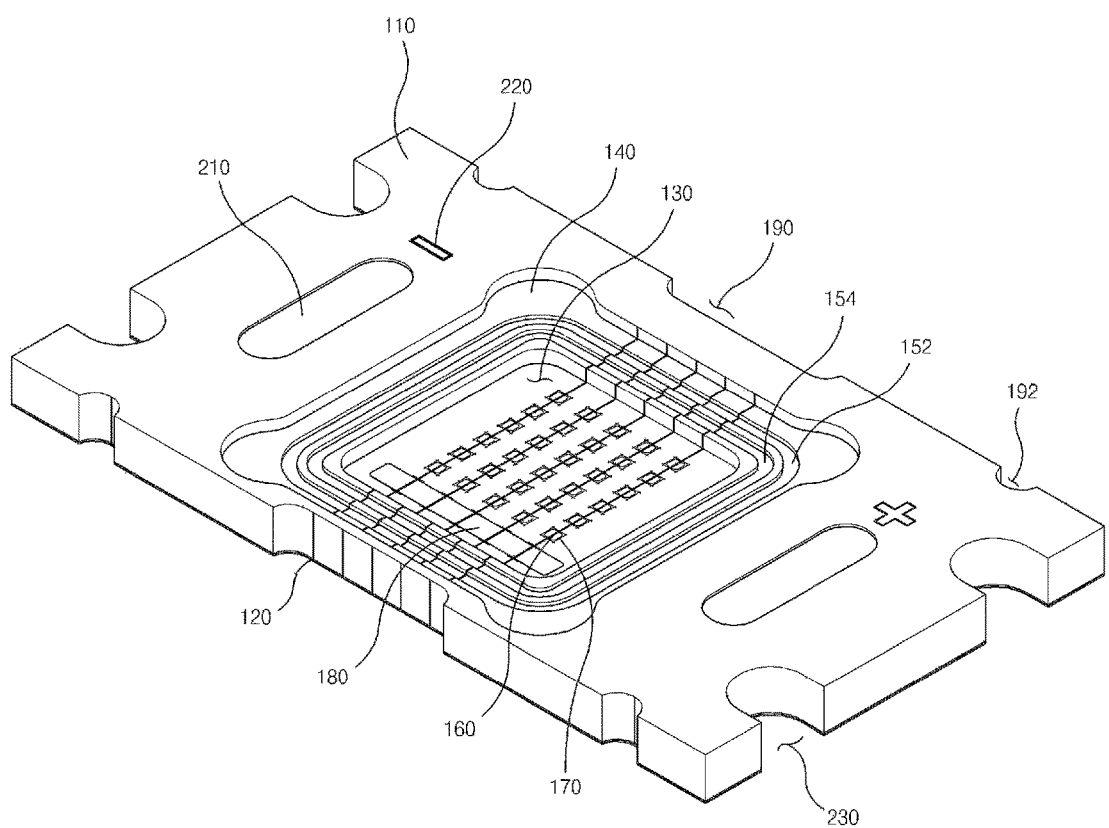
FIG. 1 is a perspective view of a chip substrate provided with a plurality of joining grooves inside the lens insert according to an exemplary embodiment of the present invention.

FIG. 1 is a perspective view of a chip substrate 100 according to an exemplary embodiment. Referring to FIG. 1, a chip substrate 100 being provided with a lens insert 140 according to an exemplary embodiment includes, a conductive layer 110, an insulation layer 120, a cavity 130, a lens insert 140, and a plurality of joining grooves 152 and 154. That is, when viewing the chip substrate 100 according to an exemplary embodiment from the top, a lens insert 140 is formed inside of the rectangular chip substrate 100, and a cavity 130 is formed inside of the lens insert 140. At this time, the lens insert 140 and the cavity 130 is formed to include an insulation layer 120.

According to an exemplary embodiment, the conductive layer 110 is stacked along a 'specific one direction' and constitutes the chip substrate 100, and it will be functioning as an electrode applying electrical power to the chip which is to be mounted in post-processing. In here, the 'specific one direction' is formed along the stacking direction of the conductive layer 110 which is being alternately stacked with the insulation layer 120 as described above; the 'specific one direction' is formed along the horizontal direction, which is the direction of stacking, according to FIG. 1.

The insulation layers 120 are alternately stacked with the conductive layers 110, thereby electrically separating the conductive layers 110. That is, the insulated chip substrates interposed by the insulation layer 120 can be functioned as a positive (+) electrode terminal and a negative (−) electrode terminal respectively.

In the present exemplary embodiment, although a case wherein one insulation layer 120 is present between the two conductive layers 110 is described as an example, configuration of a chip substrate 100 comprising two insulation layers 120 formed between three conductive layers 110 is also possible; and forming of more insulation layers 120 is also possible depending on applications thereof.

The lens insert 140 is comprised of a groove having a predetermined depth from the surface of the chip substrate 100 and downwardly formed in the area accommodating the insulation layers 120, wherein a predetermined number of edges are formed on the upper surface of the lens insert, and arcs are formed at the corners where the edges meet.

Describing more in detail with reference to FIG. 3, the lens insert 140 is formed to be a groove in the region accommodating the insulation layers 120 on the upper surface of the chip substrate 100 by sequentially stacking a conductive layer 110, an insulation layer 120, and another conductive layer 110 and so on. Specifically, the cross-sectional shape of the lens insert 140 in the present exemplary embodiment has four edges, and arcs are formed at the four corners where the edges meet.

At this time, in the present exemplary embodiment, it is preferred that the corners are formed roundly to be an arc. In manufacturing process using a cutting machine of rotational movement such as a milling machine for making a groove in the chip substrate 100 in order to form the lens insert 140, since forming a groove having a cross-section with right angle corners is difficult, it is designed in a way that a first edge is formed through a linear movement and the cutting machine can proceed to the next forming process through an arc having a predetermined curvature when forming the next edge.

That is, a groove can more easily be formed through a continuous process by allowing the milling machine to move to the position through an arc for forming the next edge.

More specifically, as illustrated in FIG. 3, the arc in the present exemplary embodiment is preferred to be formed outwardly protruded from the region being formed by the extension lines of the edges. That is, although when the arc is formed inwardly protruded from the extension lines of the edges the corners of the lens to be inserted must be machined corresponding to the curvature of the arc; when the arcs is formed outwardly protruded from the region being formed by the extension lines of the edges, even a lens having right angled corners can be easily accommodated and the lens can be fixed through the edges.

At this time, the gap between the arc and the lens formed after insertion of the lens is sealed in post-processing, thereby completing the insertion of the lens.

Although a lens insert 140 having four edges for accommodating a rectangular lens has been described in the present exemplary embodiment, the number of edges can be varied depending on the usage and the shape of the lens; arcs can be formed in some corners not every corners where the edges meet, and some corners in right angle can be formed at where the edges meet.

In addition, the lens insert 140 of the chip substrate 100 according to the present exemplary embodiment may further include an arc (not shown) formed outwardly protruded from the edges on the upper surface of the chip substrate.

That is, as shown in FIG. 3, when using a jig or a robot not using suction method for moving and joining a rectangular lens, it may help in performing the joining process smoothly, or precise joining thereof by forming arcs protruded with respect to the facing two edges of the lens insert 140 and providing a groove for the jig in the substrate.

The chip substrate 100 according to the present exemplary embodiment may further include a cavity 130 formed in the area accommodating the insulation layers 120 inside the lens insert 140 formed according to the above described description.

Thus, referring to FIG. 2, a lens insert 140 is formed inwardly by forming a groove having a predetermined depth in the chip substrate 100, and a cavity 130 is formed in the region deeper than the depth of the lens insert 140.

In the present exemplary embodiment, preferably the cavity is formed to have a downwardly narrowing shape, wherein the width thereof is getting narrower as it travels downward direction. Since the cavity 130 is formed to have a downwardly narrowing shape in order to enhance the light reflecting performance of the mounted chip, an outer wall diagonally slanted may be formed therein.

In addition, referring to FIGS. 1 and 3, the lens insert 140 according to the present exemplary embodiment may further include a first joining groove 154 and a second joining groove 152 having a predetermined depth on the surface to be in contact with the lens when inserting the lens.

That is, in the present exemplary embodiment, the lens is bonded after injecting an adhesive into the space of the second joining groove 152 comprising a predetermined groove in the surface of contact along the circumference of the lens insert 140. At this time, since the adhesive may be overflowed towards inside and outside of the joining area during the bonding process of the lens, another separate first groove 154 may be provided on the bonding surface in order to prevent such overflow and to use a right amount of the adhesive.

That is, with respect to FIGS. 1 and 3, the groove close to the cavity is the first joining groove 154, and the second joining groove 152 may be formed surrounding the first joining groove. Thus, an adhesive for bonding is injected into the second joining groove 152, and the extra adhesive being overflowed is accommodated in the first joining groove 154, therefore flowing of the adhesive into the cavity can be prevented.

In addition, the chip substrate according to the present exemplary embodiment may further include a first metal pad 160. In the present exemplary embodiment, the first metal pad 160 is formed to have a predetermined height above the surface of each of the conductive layers separated by the insulation portion inside the cavity 130, and bonded to the electrode portion formed in the chip.

In the present exemplary embodiment, the first metal pad 160 is formed to have a predetermined height above the surface of each of the conductive layers 110 separated by the insulation layers 120 inside the cavity 130, and bonded to the electrode portion formed in the chip 200.

That is, the first metal pad 160 is formed on the surface of the conductive layer 110, specifically on the surface of the conductive layer 110 corresponding to the central portion of the cavity 130 referring to FIG. 3.

That is, the first metal pad 160 comprising metal such as copper is stacked, then the chip wherein an electrode portion is formed in the bottom surface thereof such as a flip chip can be directly bonded to and mounted on the first metal pad 160 which is divided by the insulation layer 120.

In addition, according to FIGS. 1 and 3, a marking portion 170 for indicating the unit area of the metal pad for guiding the forming location of the first metal pad 160 may further included.

In addition, the chip substrate according to the present exemplary embodiment may further include a second metal pad 180. The second metal pad 180 is successively formed in the area on a plurality of conductive layers separated by a plurality of insulation layers inside of the cavity.

The second metal pad 180 can be functioning as a zener diode for protecting the chip within the substrate designed in a serial-parallel structure in order to mount a plurality of flip chips. Thus the second metal pad 180 according to the present exemplary embodiment can be successively formed in the area on the plurality of conductive layers separated by the plurality of insulation layers within the cavity.

In addition, the chip substrate 100 according to the present exemplary embodiment may further include a first metal pad 160 being formed on the upper surface of the chip substrate in order to apply electricity to the conductive layer 110.

That is, referring to FIGS. 1 and 3, electrode connecting portions 210 may be formed on the upper surface of the chip substrate 100 respectively for applying electricity thereto. In addition, a plurality of electrode marking portions 220 may further be included around the electrode connecting portions so that the electrodes can be easily recognized by the user.

Referring to FIG. 1, a plurality of insulation layers 120 are formed between a plurality of conductive layers 110 the chip substrate 100 according to the present exemplary embodiment, therefore different polarities of electricity can be applied to both of the far end conductive layers 110 of the conductive layers 110 separated by the insulation layers 120. As an example, the electrode of the conductive layers 110 can be recognized more easily by marking a pre-assigned symbol on the surface of at least one of the conductive layers 110, for example, the conductive layer 110 with a mark is presumed to be a positive (+) polarity electrode.

In addition, the chip substrate 100 according to the present exemplary embodiment may further include a plurality of side grooves 190, 192 and a bolting portions 230, The side grooves 190, 192 according to the present exemplary embodiment will be described with reference to FIG. 4. FIG. 4 is a structure of a chip substrate for manufacturing unit chip substrates as shown in FIG. 1; the structure is designed to include five unit chip substrates according to FIG. 4. That is, each of the unit chip substrates as shown in FIG. 1 is being manufactured by cutting the chip substrate shown in FIG. 4.

Therefore, due to cutting, burrs can be generated during sawing or dicing process, so there have been problems of failures such as short and the like due to the insulation breakdown caused by burrs adhering to the insulation layer which is a very thin layer.

For solving such problems, the chip substrate 100 according to the present exemplary embodiment includes a plurality of through-holes 190, 192, as shown in FIG. 4, in the area accommodating insulation layers when being cut so that a plurality of side grooves 190, 192 are formed when being cut as shown in FIG. 1. That is, the portions wherein the through-holes are formed are being present as empty spaces during the sawing or dicing process, therefore burrs are not generated.

In addition, in the chip substrate 100 according to the present exemplary embodiment, a plurality of bolting portions 230 are formed so that the chip substrates can be bonded more easily through bolting when the chip substrates are being bonded to other PCB substrates. The bolting portions are structured to have the shape of a through-hole 230 as shown in FIG. 4, the bolting portions 230 as shown in FIG. 1 can be obtained after cutting.

In FIG. 4, a plurality of grooves 240 may be used for fixing the chip substrate when cutting the chip substrate. That is, cutting is performed after fixing the chip substrate with pins being inserted into the grooves 240, so that the chip substrate shown in FIG. 1 can be manufactured.

FIG. 2 illustrates the rear surface of the chip substrate according to the present exemplary embodiment; a heat radiating portion (not shown) may further be included in the bottom surface of the chip substrate according to the present exemplary embodiment.

That is, a heat radiating portion may be bonded to the bottom surface of the chip substrate 100 in order to radiate the heat generated from the chip after an optical device chip is mounted inside the cavity 130.

At this time, the heat radiating portion may be comprised of: a heat radiating interface portion which is being boned to the insulation layer 120 and the conductive layer 110 in the bottom surface of the chip substrate 100; and a heat diffusing portion which is bonded to the heat radiating interface portion and radiating the generated heat. At this time, the heat radiating interface portion 152 made of thermal interface material (TIM) having heat dissipation function may be comprised of an insulator to obtain both insulation and heat radiation capabilities; and a heat diffusing portion comprising metal sheet such as copper, aluminum, or the like may further be included under the heat radiating interface portion.

Therefore, preferably the thickness of the heat radiating interface portion is thin considering the heat radiating characteristics.

The above described chip substrate is devised to solve the difficulties in manufacturing process wherein the shape of the lens should be formed in the shape of a circle according to the circular chip mounting space of the prior art.

According to the present exemplary embodiment, a lens insert comprising straight lines is formed prior to forming a circular cavity wherein chips are mounted, so that the lens can be formed to be a shape comprising straight lines such as a rectangle, thereby making the process simpler.

Further, arcs are formed at the corners where the edges of the lens insert meet so that the cutting machine can be moved from edge to edge more easily when making the groove of the lens insert, and besides, the bonding process of the lens can be more facilitated by forming separate jig grooves in the edges. Furthermore, according to embodiments of the present invention, a plurality of chips being mounted can be connected in a serial-parallel manner by implementing a structure wherein a plurality of optical chips can be mounted in a single substrate. Thus, the amount of supply current can be reduced compared to the structure implemented in a parallel manner, and the power consumption can be reduced eventually. Further, the damage of the insulation layer due to the burrs generated from the cutting process can be prevented through the grooves formed in the side surfaces of the chip substrate, and besides, the heat radiating effect can be enhanced through the heat radiating portion being bonded to the bottom surface of the chip substrate.

Above description is merely an exemplary description of the technical spirit of the present invention, and various modifications, changes, and substitutions are possible for a person of skill in the art within the scope without deviating from the fundamental characteristics of the present invention.

Therefore, the exemplary embodiment and the accompanying drawings disclosed in the present invention is for explanation and not for limiting the technical spirit of the present invention, and the scope of the technical spirit of the present invention is not limited by these exemplary embodiments and the accompanying drawings. The scope of protection of the present invention must be interpreted according to the following claims, and it must be interpreted in such a way that all the technical spirits within the equivalent scope of the present invention are included in the scope of the rights of the present invention.

Advantageously, when the space for lens insertion is formed to be a shape comprising straight lines, the lens to be inserted also can be formed to be a shape comprising straight lines so that the manufacturing process of the lens to be inserted into the chip substrate can be further simplified.

Furthermore, by providing a plurality of joining grooves the adhesive overflowing from one of the joining grooves is being accommodated by the other joining groove, therefore the problem of the adhesive penetrating into the light emitting section of the chip substrate can be resolved.

What is claimed is:

1. A chip substrate comprising:
   a plurality of conductive layers arranged horizontally;
   a plurality of insulation layers arranged alternately with said plurality of conductive layers and electrically separating said plurality of conductive layers from one another;
   a lens insert depressed from an upper surface of the chip substrate, the lens insert having a shape of a polygon whose corners are convex arc-shaped;
   a cavity reaching down to a predetermined depth at an area including at least a part of said plurality of insulation layers within said lens insert; and
   a plurality of joining grooves formed on a surface of said lens insert.

2. The chip substrate according to claim 1, further comprising:
   a first metal pad formed on a unit area on said plurality of conductive layers being separated by at least one of said plurality of insulation layers inside said cavity.

3. The chip substrate according to claim 2, further comprising:
   a second metal pad being successively formed on the plurality of insulation layers separated from the plurality of insulation layers inside said cavity.

4. The chip substrate according to claim 1, wherein said joining grooves include:
   a first joining groove being formed surrounding an outer area of said cavity on the surface of said lens insert; and
   a second joining groove being formed surrounding said first joining groove.

5. The chip substrate according to claim 1, wherein said chip substrate further includes:
   a heat radiating portion being attached to a bottom surface of said chip substrate.

6. The chip substrate according to claim 2, wherein said chip substrate further includes:
   a plurality of marking portions to indicate said unit areas inside said cavity.

7. The chip substrate according to claim 1, wherein said chip substrate further includes:
   an electrode marking portion to indicate an electrode for at least any one conductive layer of said plurality of conductive layers separated by an insulation layer of said plurality of insulation layers on the upper surface of said chip substrate.

8. The chip substrate according to claim 1, wherein said chip substrate further includes:
   a plurality of side grooves, at side surfaces of said chip substrate, inwardly concave and accommodating said plurality of insulation layers.

* * * * *